(12) United States Patent
Law et al.

(10) Patent No.: US 8,617,349 B2
(45) Date of Patent: Dec. 31, 2013

(54) SHOWERHEAD ASSEMBLY FOR PLASMA PROCESSING CHAMBER

(75) Inventors: Kam S. Law, San Jose, CA (US); Masato Toshima, Sunnyvale, CA (US); Wendell Thomas Blonigan, Pleasanton, CA (US); Linh Can, San Jose, CA (US); Robin K. F. Law, Hong Kong (CN)

(73) Assignee: Orbotech LT Solar, LLC., San Jose, CA (US)

( * ) Notice: Subject to any disclaimer, the term of this patent is extended or adjusted under 35 U.S.C. 154(b) by 524 days.

(21) Appl. No.: 12/906,053

(22) Filed: Oct. 15, 2010

(65) Prior Publication Data
US 2011/0088847 A1 Apr. 21, 2011

Related U.S. Application Data

(60) Provisional application No. 61/252,117, filed on Oct. 15, 2009.

(51) Int. Cl.
| | |
|---|---|
| H01L 21/3065 | (2006.01) |
| C23C 16/00 | (2006.01) |
| C23C 16/455 | (2006.01) |
| C23C 16/50 | (2006.01) |
| B23P 15/16 | (2006.01) |
| B23B 35/00 | (2006.01) |

(52) U.S. Cl.
USPC .......... 156/345.34; 156/345.33; 156/345.43; 156/345.47; 118/715; 118/723 R; 118/723 E; 408/1 R; 29/896.6; 29/890.14

(58) Field of Classification Search
USPC .......... 156/345.33, 345.34, 345.43, 345.47; 118/715, 723 R, 723 E; 408/1 R; 29/896.6, 890.14
See application file for complete search history.

(56) References Cited

U.S. PATENT DOCUMENTS

| | | | |
|---|---|---|---|
| 4,612,077 A * | 9/1986 | Tracy et al. ............... | 156/345.34 |
| 5,136,975 A * | 8/1992 | Bartholomew et al. ....... | 118/715 |
| 5,746,875 A * | 5/1998 | Maydan et al. .......... | 156/345.34 |
| 6,036,782 A | 3/2000 | Tanaka et al. | |

(Continued)

FOREIGN PATENT DOCUMENTS

| | | |
|---|---|---|
| EP | 1422317 A1 | 5/2004 |
| EP | 2312613 A2 | 4/2011 |
| TW | 2007-10928 A | 3/2007 |

OTHER PUBLICATIONS

European Search Report for Application No. EP 10194536.8 dated Apr. 1, 2011.

(Continued)

*Primary Examiner* — Jeffrie R Lund
(74) *Attorney, Agent, or Firm* — Nixon Peabody LLP; Joseph Bach, Esq.

(57) ABSTRACT

A showerhead for a plasma process apparatus for processing substrates, comprising a showerhead body comprising a top plate and a bottom plate defining a cavity in between; a gas inlet formed in the top plate; a perforated plate positioned between the top plate and the bottom plate and dissecting the cavity into an upper gas compartment and a lower gas compartment; and, wherein the bottom plate comprises a plurality of elongated diffusion slots on its lower surface and a plurality of diffusion holes on its upper surface, each of the diffusion holes making fluid connection from the lower gas compartment to more than one of the diffusion slots.

29 Claims, 6 Drawing Sheets

(56) References Cited

U.S. PATENT DOCUMENTS

| | | | |
|---|---|---|---|
| 6,113,984 A * | 9/2000 | MacLeish et al. | 427/255.32 |
| 6,586,886 B1 * | 7/2003 | Katz et al. | 315/111.21 |
| 6,677,712 B2 * | 1/2004 | Katz et al. | 315/111.21 |
| 6,793,733 B2 * | 9/2004 | Janakiraman et al. | 118/715 |
| 7,270,713 B2 * | 9/2007 | Blonigan et al. | 118/715 |
| 7,854,820 B2 * | 12/2010 | De La Llera et al. | 156/345.34 |
| 8,152,923 B2 * | 4/2012 | Mitrovic et al. | 118/715 |
| 8,287,646 B2 * | 10/2012 | Mitrovic et al. | 118/715 |
| 8,454,850 B2 * | 6/2013 | Dong et al. | 216/63 |
| 2003/0140851 A1 * | 7/2003 | Janakiraman et al. | 118/715 |
| 2004/0060514 A1 * | 4/2004 | Janakiraman et al. | 118/715 |
| 2005/0183827 A1 | 8/2005 | White et al. | |
| 2007/0181531 A1 * | 8/2007 | Horiguchi et al. | 216/67 |
| 2008/0090417 A1 * | 4/2008 | De La Llera et al. | 438/689 |
| 2008/0196666 A1 | 8/2008 | Toshima | |
| 2011/0011338 A1 * | 1/2011 | Chuc et al. | 118/715 |
| 2011/0088847 A1 * | 4/2011 | Law et al. | 156/345.34 |

OTHER PUBLICATIONS

Examination Report for Taiwanese Patent Application No. 99135138 dated Aug. 13, 2013.

* cited by examiner

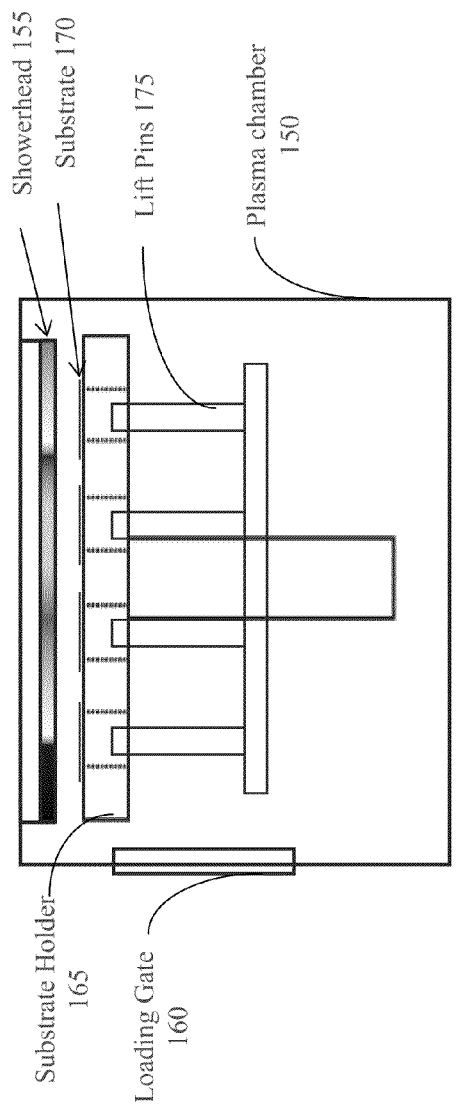
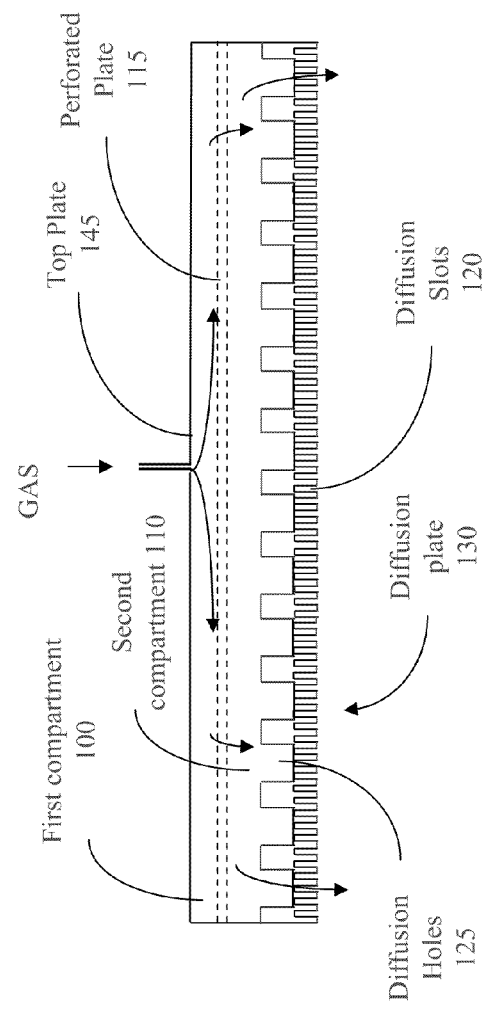
*Figure 1A*
*Figure 1B*

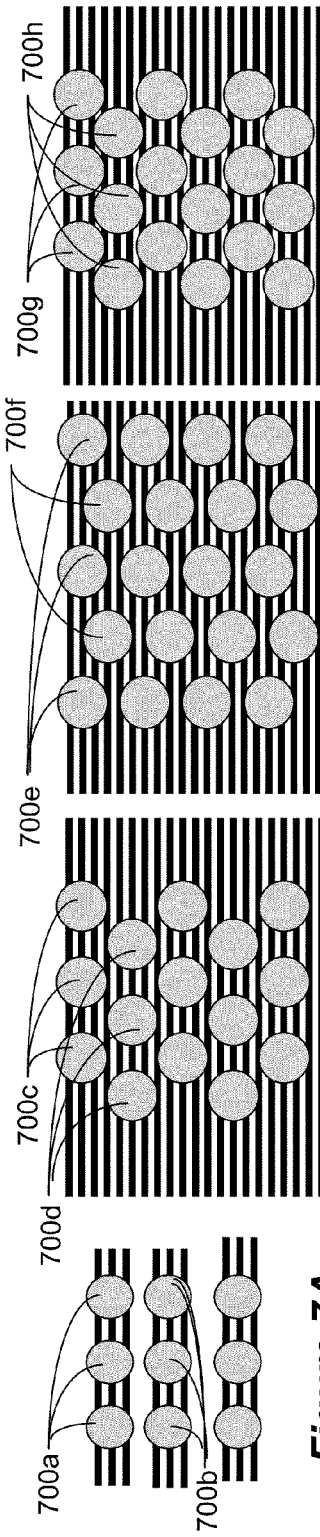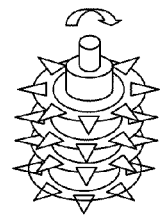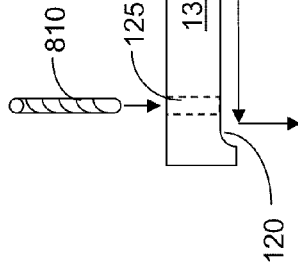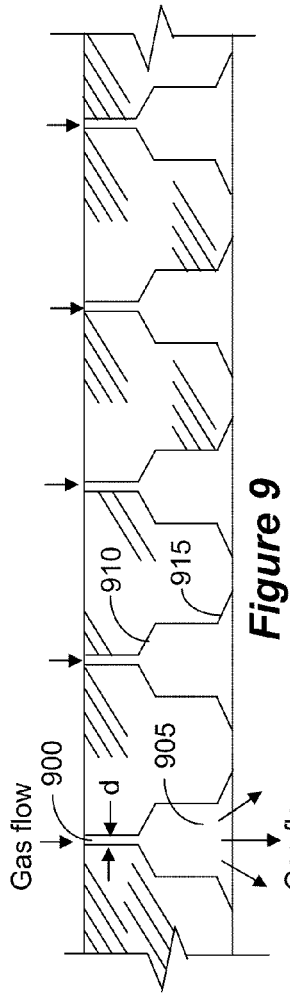

SHOWERHEAD ASSEMBLY FOR PLASMA PROCESSING CHAMBER

RELATED APPLICATION

This application claims priority benefit from U.S. Provisional Patent Application No. 61/252,117, filed Oct. 15, 2009, the disclosure of which is incorporated herein by reference in its entirety.

BACKGROUND

1. Field of the Application

The invention relates to showerheads for plasma processing chambers, such as for Chemical Vapor Deposition (CVD), Plasma Enhanced Chemical Vapor Deposition (PECVD), and etching of films.

2. Related Art

Apparatus of plasma processing, such as, e.g., plasma enhanced chemical vapor deposition of films, utilize showerhead to introduce the gases into the chamber. Various showerheads for plasma chambers are known in the art. The showerhead delivers processing gas into the plasma processing chamber. Some of the issues considered in designing a showerhead include proper mixing of the gas, control over the distribution of the gas throughout the chamber, control over the temperature of the showerhead and gases within the showerhead, pitting of the showerhead by plasma species, rate of gas delivery, complexity and cost of production, and more.

The design of the showerhead assembly is critical, as it directly affects the quality of the process in the plasma chamber. For example, the design of the showerhead directly affects the uniformity of the film deposited in PECVD chambers. Uniformity of deposited film becomes more difficult to control as the size of the substrate increases, for example when processing large substrates for LCD or thin-film solar panels. Uniformity is also more difficult to control when performing batch processing, i.e., when forming film on several substrates concurrently in the same chamber. However, as is evident these days, the sizes for LCD becomes larger and larger, and recent popularity of solar panels increases the demands on systems for forming high quality films on large substrates or on multiple substrates concurrently.

One problem with the current state of the art showerhead is its complexity and cost of manufacturing, mainly due to the side and shape of the gas diffusion holes. FIG. 9 illustrates a partial view of a showerhead according to the state of the art, in a cross-section view. As seen in FIG. 9, there are many gas diffusion holes having a complex and expensive shape to manufacture. First holes 900 of small diameter d are drilled from the top surface, generally using a small diameter dill bit that has very limited length, and must be replaced multiple times during the manufacture of a single part. Then holes 905 of larger diameter are drilled from the bottom surface. In this step it is very important that the bottom holes 905 be coaxially aligned to the top holes 900, which complicates the fabrication of the showerhead. Also, chamfers 910 and 915 need to be fabricated, which further increases the cost of fabrication. Moreover, due to the small diameter d of holes 900, conventional sand blasting treatment of the showerhead cannot be performed, since it clogs the holes. Therefore, special chemical cleaning must be done instead, followed by close inspection under magnification of all holes to ensure they are all open.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the invention provide a showerhead assembly that is easier and significantly less expensive to manufacture, while having improved gas distribution. Showerheads made according to embodiments of the invention do not require the drilling of large number of small diameter holes. Embodiments of the invention also do not require complex hole shapes. Instead, control over gas distribution gradient or uniformity is done using a baffle plate. A second plate diffuses the gas into the chamber using relatively large diameter holes leading to diffusion slots. Since the diffusion slots are rather large, ionization may take place in the diffusion slots without harming the showerhead. IN such circumstances, the diffusion plate may be referred to as gas ionization plate. According to further embodiments, the showerhead assembly is coupled to the RF generator to also act as an electrode for the plasma chamber.

A showerhead for a plasma process apparatus for processing substrates, comprising a top plate having gas inlet; a perforated plate positioned below the top plate and distanced from the top plate so as to define an upper gas compartment with the top plate; a diffusion plate positioned below the perforated plate and distanced from the perforated plate so as to define a lower gas compartment, the diffusion plate facing the substrate to be processed; and, wherein the diffusion plate comprises a plurality of elongated diffusion slots on its lower surface and a plurality of diffusion holes on its upper surface, each of the diffusion holes making fluid connection from the lower gas compartment to more than one of the diffusion slots.

A showerhead for a plasma process apparatus for processing substrates, comprising a showerhead body comprising a top plate and a bottom plate defining a cavity in between; a gas inlet formed in the top plate; a perforated plate positioned between the top plate and the bottom plate and dissecting the cavity into an upper gas compartment and a lower gas compartment; and, wherein the bottom plate comprises a plurality of elongated diffusion slots on its lower surface and a plurality of diffusion holes on its upper surface, each of the diffusion holes making fluid connection from the lower gas compartment to more than one of the diffusion slots.

According to embodiments of the invention, a simple and cost-effective method for fabricating a gas ionization plate is disclosed, the method comprising fabricating a plate; using gang cutter to form a plurality of gas ionization slots on the lower surface of the plate; and, drilling a plurality of gas distribution holes from the top surface of the plate such that each holes reaches and opened to a plurality of the gas ionization slots.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate features of the exemplary embodiments in a diagrammatic manner. The drawings are not intended to depict every feature of actual embodiments nor relative dimensions of the depicted elements, and are not drawn to scale.

FIG. 1A illustrates a plasma processing chamber that may incorporate a showerhead according to the invention.

FIG. 1B is a schematic illustrating in a cross section showing major elements of a showerhead according to an embodiment of the invention.

FIGS. 7A-7D illustrate different arrangements for the holes and slots.

FIGS. 8A and 8B illustrate a method according to embodiments of the invention for cost-effectively cutting the diffusion slots.

FIG. 9 illustrate holes design of prior art showerhead.

DETAILED DESCRIPTION

Figure 2:
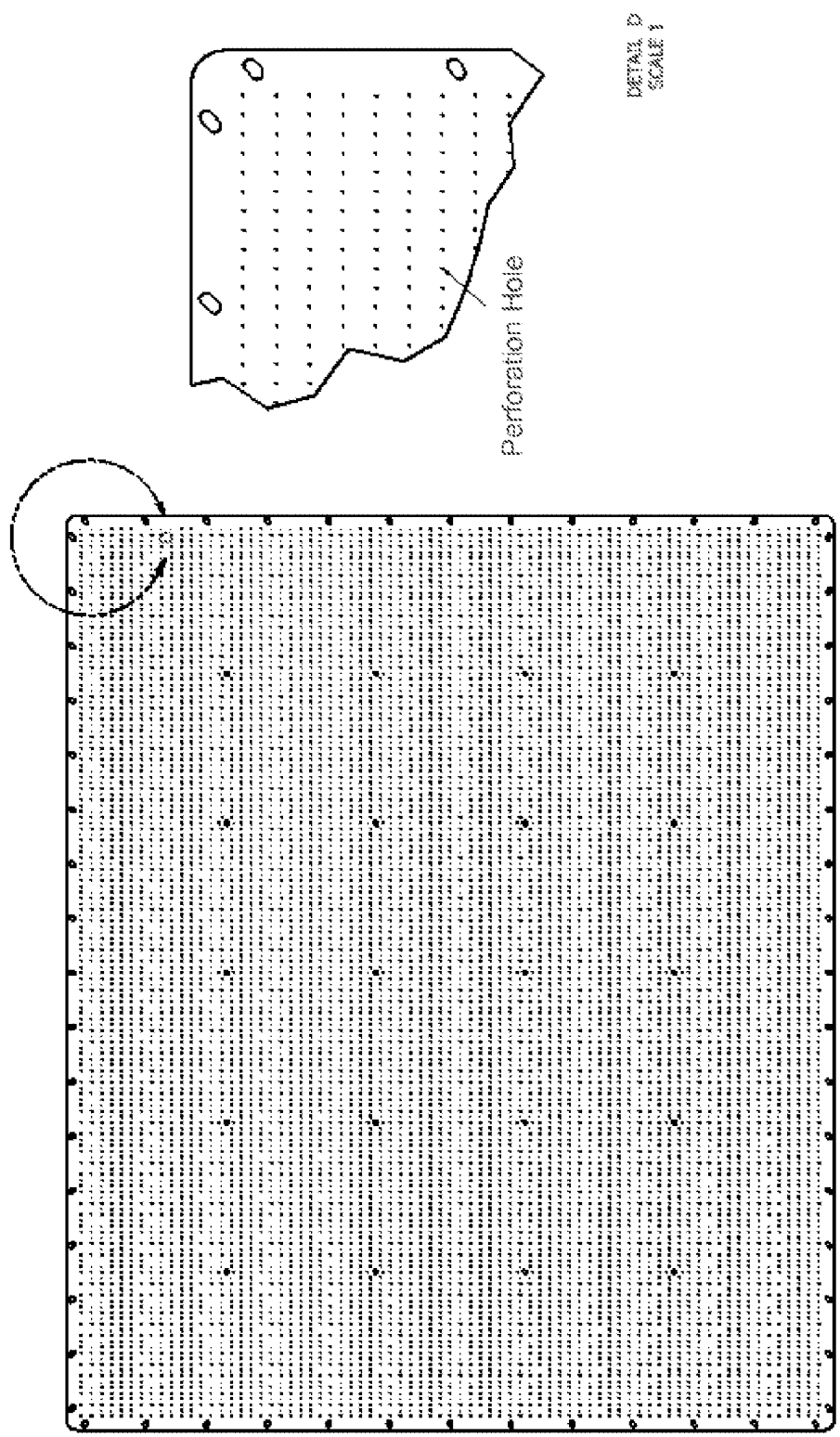
FIG. 2 illustrates a top elevation of the perforated/gas restriction plate, according to an embodiment of the invention, while Detail D illustrates a close-up section of the perforated/gas restriction plate.

FIG. 1A illustrates a plasma processing chamber 150 that may incorporate a showerhead 155 according to the invention. In this example the chamber 150 includes a loading gate 160 for loading and unloading substrates. A substrate holder 165 may be a simple holder, a holder incorporating a heater, a chuck, such as, e.g., an electrostatic chuck, etc. The substrate holder 165 may hold a single substrate or a plurality of substrates. In this example, the holder supports a plurality of substrates 170, each of which may be lifted from the holder 165 using lift pins 175. Also, the showerhead 155 may be coupled to the ground or RF potential of an RF generator, e.g., via an impedance match circuit (not shown).

FIG. 1B is a schematic illustrating in a cross section showing major elements of a showerhead according to an embodiment of the invention. In this particular example the showerhead is rectangular, but other shape can be used, depending on the shape of the plasma chamber. Since flat panel displays and solar cells are fabricated inside a rectangular chamber, in this embodiment the showerhead is rectangular.

The showerhead comprises perforated plate 115, which may act as a baffle plate restricting gas flow, and is positioned so as to divide the internal space of the showerhead into a first compartment 100 and a second compartment 110. Due to the flow restriction action of the baffle plate, first compartment 100 has higher gas pressure than the second compartment. The bottom of the showerhead is formed by a diffusion plate 130, which has elongated diffusion slots 120 at the lower surface, so as to face the substrate being processed. The diffusion slots may be made large enough to support gas ionization within the slots. Diffusion holes 125 connect to the diffusion slots 120, to enable gas from the second compartment 110 to be delivered to the process region via the diffusion slots. Notably, each diffusion hole 125 connects to a plurality of diffusion slots 120. This feature enables high conductance of the gases into the plasma chamber.

As is shown by the arrows in FIG. 1B, the gas from a gas source enters the showerhead from the top plate 145 and then enters the first compartment 100. The perforated plate 115 forces the gas to distribute into the second compartment 110 according to pressure distribution determined by the design of the perforated plate. In this manner, the flow from the first compartment to the second compartment can be controlled. For example, the size, number and distribution of the perforations can be designed to cause the gas to distribute evenly or in a pressure gradient into the second compartment, as desired by the particular design. According to embodiments of the invention the perforation can be made to have a diameter in the range of 0.006" to 0.500".

The diffusion holes 125 then distribute the gas into the diffusion slots 120. In this embodiment the diffusion holes 125 are circular and extend vertically to form a fluid passage from the second compartment 110 to the diffusion slots 120. Each diffusion hole 125 forms passage to several diffusion slots 120. In this embodiment the diffusion slots 120 have rectangular cross-section and each extend horizontally the entire length of the showerhead to enable high conductance of gas. According to embodiments of the invention the diffusion holes can be made to have a diameter in the range of 0.025" to 2.000", while the diffusion slots can be made to have a width of 0.010" to 1.000", a depth of 0.010" to 1.000", and a slot pitch of 0.015" to 6.000".

FIG. 2 illustrates a top elevation of the perforated plate 115, according to an embodiment of the invention, while Detail D illustrates a close-up section of the perforated plate 115. The perforated plate 115 has many small holes to serve as a baffle plate, so that gas is delivered controllably from the first compartment 100 to the second compartment 110. This feature ensures the controlled uniform or gradient distribution of the gas in spite of the high conductance of the diffusion plate. For example, in some applications a uniform gas distribution may be needed, while in other applications center high or center low gas flow may be needed.

Figure 3:
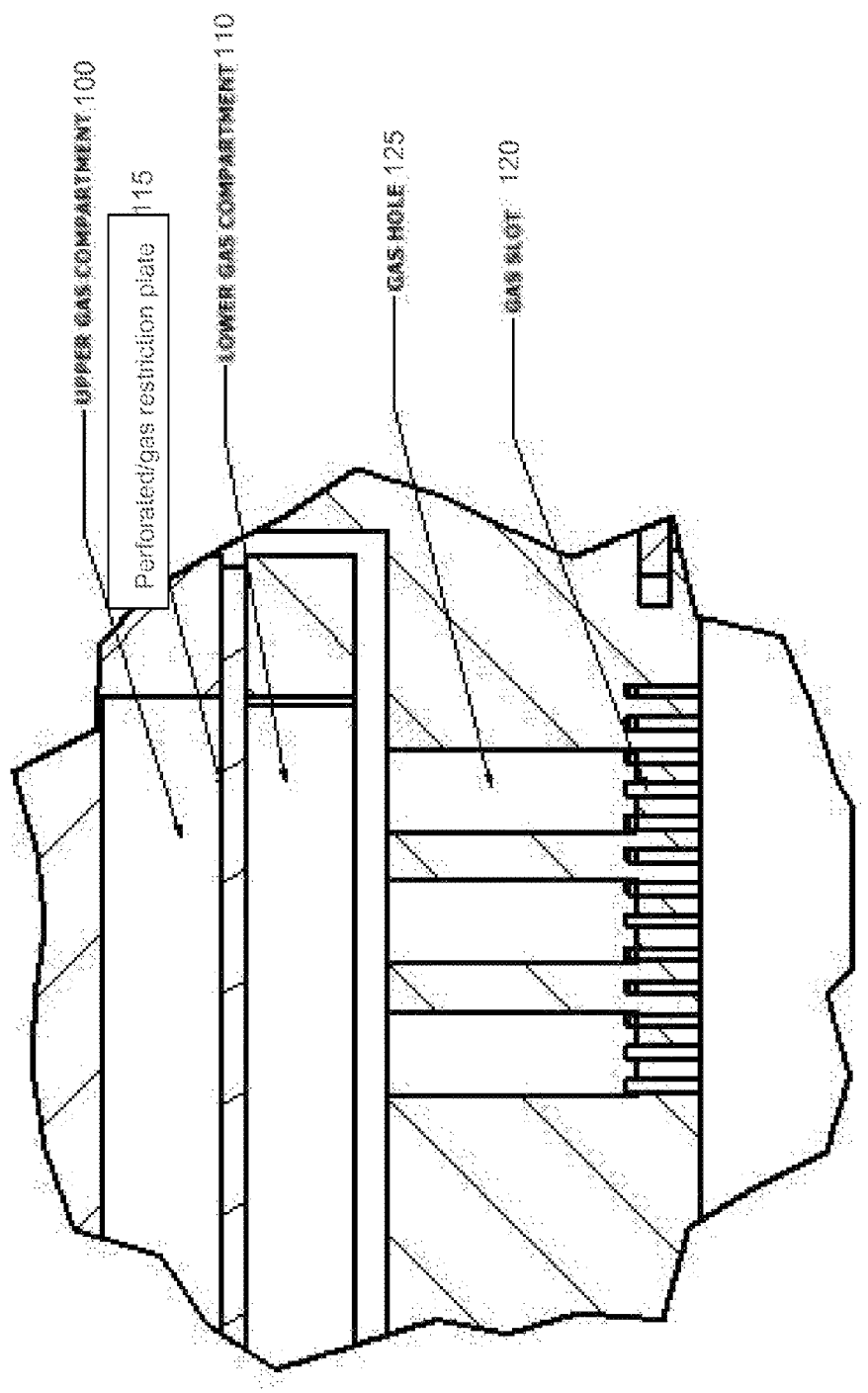
FIG. 3 illustrates a cross-section of a section of the showerhead according to an embodiment of the invention.

FIG. 3 illustrates a partial cross-section of showerhead according to an embodiment of the invention. FIG. 3 shows the upper gas compartment 100, the baffle (or flow restriction) plate 115, lower gas compartment 110, the gas distribution holes 125, and the gas distribution slots 120. As shown, in this embodiment each gas hole 125 connects to several gas slots 120. Also, in this embodiment the holes are staggered such that each row of holes is offset from the rows that are immediately next on each side of it. As explained above, in this embodiment the holes are circular and are vertical, such that each hole forms a passage from the second compartment 110 to several diffusion slots 120. Of course, other hole shapes can be used. The diffusion slots 120 are horizontal and each diffusion slot intersects all diffusion holes 125 in one row. Also, as will be shown in other embodiments, each slot 120 may intersect holes belonging to more than one row.

Figure 4:
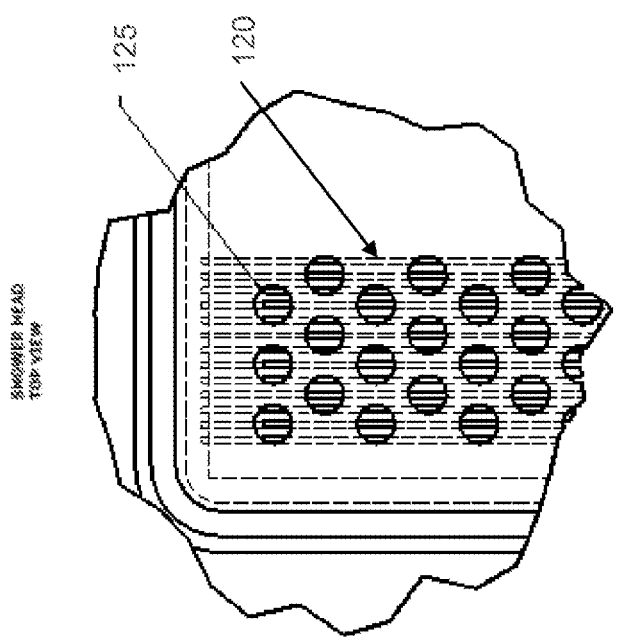
FIG. 4 illustrates a top view of the diffusion plate according to an embodiment of the invention.
Figure 5:
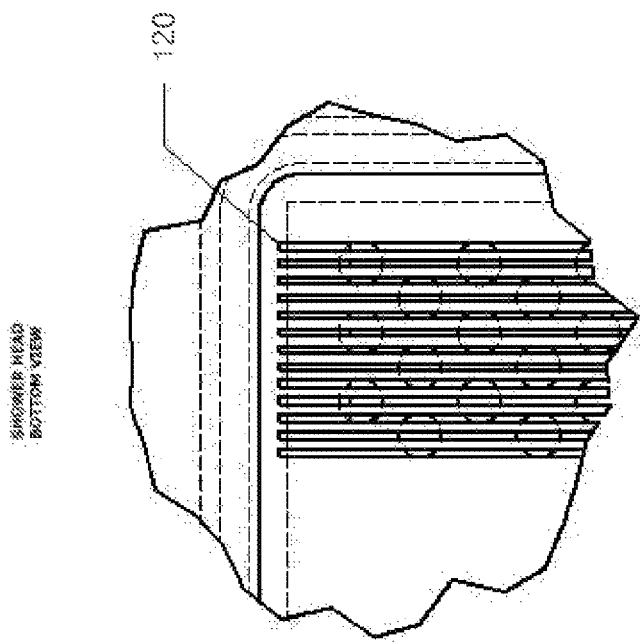
FIG. 5 illustrates a bottom view of the diffusion plate according to an embodiment of the invention.

FIG. 4 illustrates a top view of the diffusion plate 130, i.e., the view from inside the second compartment 110, looking down towards the plasma processing chamber. FIG. 4 shows the round gas holes 125 arranged in rows, wherein each hole 125 leads to several diffusion slots 120 (the slots are shown in broken lines). FIG. 4 also shows how each successive row of diffusion holes is offset from its immediate neighbor rows, such that the holes are shifted. FIG. 5 illustrates a bottom view of the diffusion plate 130, i.e., looking from inside the plasma processing chamber towards the second compartment 110. FIG. 5 shows the slots 120 in solid lines and round gas holes 125 in broken lines, behind gas slots 120. Each of the holes is leading to several diffusion slots and each diffusion slot intersect all of the holes in one row of holes.

Figure 6:
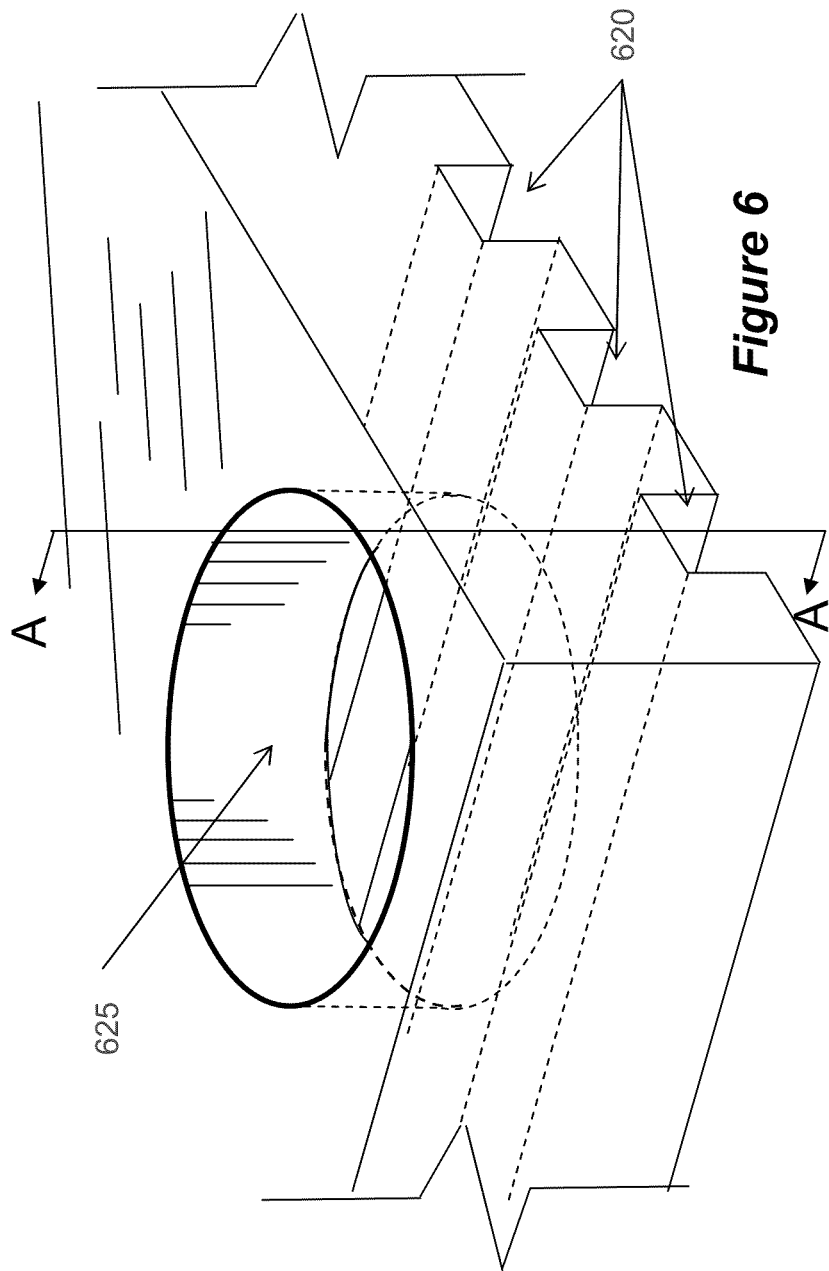
FIG. 6 illustrates an embodiment in which the diffusion plate is made of a single plate of metal.

According to the embodiment illustrated in FIG. 6, the diffusion plate is made of a single plate of metal. The bottom surface of the plate is machined to have diffusion slots 620, while the top surface of the plate is drilled to have the rows of holes 625, such that each drilled hole intersects several diffusion slots. In one embodiment, each hole intersect three diffusion slots, one of which passes in the center of the hole, while the other two pass at the opposing edge of the hole, as shown in FIG. 6. Since the rows of holes are staggered, each hole has one diffusion slot passing at its center and two passing at its opposing edges.

As noted above, other arrangements for the gas distribution holes and gas distribution slots can be used. For example, FIG. 7A illustrate an arrangement wherein multiple rows of holes are provided, wherein each hole in each row intersect three slots and wherein each slot intersect all of the holes in a row. The row of holes are aligned, i.e., not staggered. That is, all of the holes 700a of one row, are aligned with the holes 700b of the neighboring row of holes. In this respect, the rows are defined as the collection of holes that are aligned in the slots direction. FIG. 7B, on the other hand, illustrates the staggered rows arrangement, as shown in FIGS. 3-5. That is, holes 700d of one row are shifted from the holes 700c of its neighboring row. The shift is such that each holes 700d is aligned exactly midway between two holes 700c of the neighboring row. FIG. 7C illustrates a case wherein the row of holes are aligned (i.e., not staggered) but are shifted in a direction perpendicular to the slots, such that certain slots intersect holes from two neighboring rows of holes. That is, holes 700f of one row are exactly aligned with holes 700e of its neighboring row, but they are shifted in a direction perpendicular to the slots, such that holes from one row overlaps slots that are connected to holes from another row. FIG. 7D illustrates the case wherein the holes in a neighboring row are staggered and shifted. That is, holes 700h from one row are positioned midway between holes 700g of its neighboring row, and the holes 700h overlap over slots that are also connected to holes 700g from the neighboring row.

FIG. 8A illustrates a cross section along line A-A in FIG. 6, to enable understanding of a fabrication method according to an embodiment of the invention. As shown in FIG. 8A, a circular saw 800, also referred to as gang cutter, is used to machine the gas distribution slots 120 in the lower surface of the gas distribution plate 130. As shown in FIG. 8B, a gang cutter having multiple blades can be used to cut several slots 120 at a single pass. Drill 805 is used to drill the gas distribution holes 125 from the upper surface of the gas distribution plate.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A showerhead assembly for a plasma process apparatus for processing substrates, comprising:
   a top plate having gas inlet;
   a perforated plate positioned below the top plate and distanced from the top plate so as to define an upper gas compartment with the top plate;
   a gas distribution plate positioned below the perforated plate and distanced from the perforated plate so as to define a lower gas compartment, the gas distribution plate facing the substrate to be processed; and,
   wherein the gas distribution plate comprises a plurality of elongated gas distribution slots on its lower surface and a plurality of gas distribution holes on its upper surface, each of the gas distribution holes having a diameter larger than holes in the perforated plate, and each of the gas distribution holes making fluid connection from the lower gas compartment to more than one of the gas distribution slots.

2. The showerhead assembly of claim 1, wherein the gas distribution holes are arranged in a plurality of rows and each gas distribution slot intersects all holes in one row.

3. The showerhead assembly of claim 2, wherein the plurality of rows are staggered in the direction of the gas distribution slots, such that each row of gas distribution holes is offset from the rows that are immediately next to it.

4. The showerhead assembly of claim 3, wherein the plurality of rows are shifted in a direction perpendicular to the gas distribution slots, such that holes in a row of gas distribution holes overlap at least one gas distribution slot connected to holes from an immediately neighboring row.

5. The showerhead assembly of claim 2, wherein the plurality of rows are shifted in a direction perpendicular to the gas distribution slots, such that holes in a row of gas distribution holes overlap at least one gas distribution slot connected to holes from an immediately neighboring row.

6. The showerhead assembly of claim 1, wherein the gas distribution plate comprises a single plate of metal having its bottom surface machined to form the gas distribution slots and its top surface drilled to form the rows of gas distribution holes.

7. The showerhead assembly of claim 1, wherein the perforated plate is configured to provide a uniform gas distribution into the lower gas compartment.

8. The showerhead assembly of claim 1, wherein the perforated plate is configured to provide a non-uniform gas distribution into the lower gas compartment.

9. The showerhead assembly of claim 1, wherein the gas distribution slots are configured to support gas ionization inside the gas distribution slots.

10. The showerhead assembly of claim 9, wherein the gas distribution slots are of width of 0.010" to 1.000", a depth of 0.010" to 1.000", and a slot pitch of 0.015" to 3.000".

11. The showerhead assembly of claim 9, wherein the gas distribution holes are of diameter 0.025" to 6.000".

12. A showerhead assembly for a plasma process apparatus for processing substrates, comprising:
   a showerhead body comprising a top plate and a bottom ionization plate, defining a cavity in between;
   a gas inlet formed in the top plate;
   a gas restriction plate positioned between the top plate and the ionization plate and dissecting the cavity into an upper gas compartment and a lower gas compartment and restricting flow such that the upper gas compartment supports a higher gas pressure than the lower gas compartment; and, wherein the bottom ionization plate comprises a single metallic plate having plurality of elongated ionization slots machined on its lower surface and a plurality of diffusion holes drilled on its upper surface, each of the diffusion holes making fluid connection from the lower gas compartment to more than one of the ionization slots.

13. The showerhead assembly of claim 12, wherein the diffusion holes are arranged in a plurality of rows and each ionization slot intersects all holes in one row.

14. The showerhead assembly of claim 12, wherein the plurality of rows are staggered such that each row of holes is offset from the rows that are immediately next to it.

15. The showerhead assembly of claim 12, wherein the plurality of rows are shifted in a direction perpendicular to the ionization slots, such that holes in one row overlap at least one ionization slot connected to holes from an immediately neighboring row.

16. The showerhead assembly of claim 12, wherein the gas restriction plate comprises perforations configured to provide a uniform gas distribution into the lower gas compartment.

17. The showerhead assembly of claim 12, wherein the gas restriction plate comprises perforations configured to provide a gradient gas distribution into the lower gas compartment.

18. The showerhead assembly of claim 12, wherein the ionization slots are of width 0.010" to 1.000", a depth of 0.010" to 1.000", and a slot pitch of 0.015" to 3.000".

19. The showerhead assembly of claim 12, wherein the gas diffusion holes are of diameter 0.025" to 6.000".

20. A showerhead assembly for a plasma process apparatus for processing substrates, comprising:

a gas ionization plate, the gas ionization plate having a top surface and a bottom surface, a plurality of gas ionization slots cut on the lower surface of the plate, a plurality of gas distribution holes drilled from the top surface of the plate such that each of the gas distribution holes reaches and opens to a plurality of the gas ionization slots.

21. The showerhead assembly of claim 20, wherein each gas ionization slot is cut to a depth of 0.010" to 1.000" and width of 0.010" to 1.000".

22. The showerhead assembly of claim 20, wherein each gas distribution hole is drilled to a depth of 0.010" to 10.000" and diameter of 0.025" to 6.000".

23. The showerhead assembly of claim 20, wherein each gas distribution hole intersect three slots, wherein one of the three slots intersects the gas distribution hole in the center of the gas distribution hole.

24. The showerhead assembly of claim 20, wherein the gas distribution holes are arranged in a plurality of rows, each gas distribution slot intersects all holes in one row, and each hole in a row intersects a plurality of gas ionization slots.

25. The showerhead assembly of claim 24, wherein each of the gas ionization slots intersect gas distribution holes belonging to more than one row.

26. The showerhead assembly of claim 20, wherein each of the plurality of gas distribution holes is circular and vertical.

27. A method for fabricating a gas ionization plate for use in a showerhead assembly of a plasma processing chamber, comprising:

fabricating a plate;

using gang cutter to form a plurality of gas ionization slots on the lower surface of the plate; and, drilling a plurality of gas distribution holes from the top surface of the plate such that each of the gas distribution holes reaches and opens to a plurality of the gas ionization slots.

28. The method of claim 27, wherein each gas ionization slot is cut to a depth of 0.010" to 1.000" and width of 0.010" to 1.000".

29. The method of claim 27, wherein each gas distribution hole is drilled to a depth of 0.010" to 10.000" and diameter of 0.025" to 6.000".

* * * * *